METHOD OF MAKING PRECISION MASKS

Filed Nov. 3, 1967

ACHILLES J. LEPHAKIS
KENNETH G. STEPHENS
INVENTORS
BY H C Goldwire
AGENT

United States Patent Office 3,510,409
Patented May 5, 1970

3,510,409

METHOD OF MAKING PRECISION MASKS

Achilles J. Lephakis, Princeton, and Kenneth G. Stephens, Dallas, Tex., assignors to LTV Electrosystems, Inc., Greenville, Tex., a corporation of Delaware Filed Nov. 3, 1967, Ser. No. 680,507
Int. Cl. C23b *5/64;* C03c *17/06*
U.S. Cl. 204—15 6 Claims

ABSTRACT OF THE DISCLOSURE

This invention provides a method of making a precision mask for use in forming printed circuits and the like. A transparent, nonconductive plate is coated with a conductive material, the coating is scribed to isolate particular areas from a background area, and the background area is electroplated until it is opaque.

This invention relates to precision negative masks, and more particularly to a method of making a precision negative mask for the production of high-frequency printed circuits and the like.

Along with the extensive use of printed circuits in present day electronic components, numerous techniques have been developed for the efficient production of printed circuits. Difficulties have arisen in several phases of this production, particularly in the construction of printed circuits with patterns required to have very accurate dimensions, as is the case for printed circuits used in high-frequency applications. Conventional methods of printed circuit production, such as stenciling, with an acid resist, a desired circuit pattern upon a foil-covered board and subsequently etching the board, have not been satisfactorily used for such high-precision production because such methods do not produce sufficiently accurate patterns.

A method which is more frequently used in such precision work includes the initial preparation of the circuit design on an enlarged scale and a subsequent reduction to actual size by photographic techniques. The enlarged circuit design is normally formed on a plastic base-material by cutting or scribing the material. The photographic reduction method produces a negative of the circuit, which is then used in a contact printing process to form the actual printed circuit.

The contact printing process, by which printed circuits are formed fom a negative mask, is well-known in the art. It normally includes coating a metal-plated board with a light-sensitive resist, placing a negative mask of the desired circuit adjacent the resist coating, and exposing the resist coating to white light through the negative mask. The mask allows light to expose the resist coating at circuit line areas only, and the resist coating thus exposed is chemically changed such that it is resistant to solvent action. The board is then "developed" by immersing it in a solvent which removes the resist in the background areas but not the resist in the circuit areas, leaving the metal plating in the background areas uncoated with resist. The board is then placed in an etch which attacks the uncoated metal plating. The plating in the background areas is thus removed, while that of the circuit line areas, protected by the resist, remains and forms the conductive portion of the printed circuit board.

The photographic reduction process is the one which is commonly used for making precision negative masks for use in the contact printing process, for drafting errors may be minimized by initial drafting on a large scale and subsequent reduction. The photographic reduction method, however, has introduced problems of its own. The plastic base-materials used for initial drafting and the reduced negative produced by the photographic process are subject to dimensional change when changes occur in the ambient humidity and temperature. Therefore, they must be carefully maintained in a controlled environment having stable temperature and humidity conditions in order to ensure that the base-material and/or the reduced negative will not alter dimensionally while in use. The facilities required to maintain such stable temperature and humidity conditions add a considerable expense to the production cost. Further, the making of accurate photographic reductions requires the use of specialized and very expensive graphic arts cameras and accessories. hus, the necessity of expensive photographic equipment and environmental facilities greatly increases the cost of production and makes the photographic reduction method prohibitively expensive for the small producer or where only limited production is required.

Although the photographic reduction method may minimize initial drafting errors by reducing the size of the drafted pattern, it also introduces additional procedures in which other errors may result. For example, errors may occur in the alignment of the camera for accurate reduction and in the exposure and development of its photographic film. A further disadvantage inherent in the photographic reduction process arises when large circuit patterns are required. In such cases, the reduction factor available is limited by the physical dimensions of the camera and its mounting. Further, the initial scribing or cutting of a design in the plastic base-materials available produces distortion, since the material may stretch or tear as it is scribed.

It is, accordingly, a major object of the present invention to provide a new and improved method of forming a negative mask for the production of printed circuits and the like.

Another object is to provide a method of forming a negative mask with pattern dimensions of sufficient accuracy for the production of precision-printed circuits suitable for high-frequency applications.

A further object is to provide a method of producing a negative mask, which method does not require a photographic reduction process.

Yet another object is to minimize dimensional distortion, in the production of such negative masks, which is caused by temperature and humidity variations.

A still further object is to provide a method having the above-stated advantages which nonetheless can be inexpensively practiced.

Other objects and advantages will be apparent from the specification and claims and from the accompanying drawing illustrative of the invention.

Figure 1:
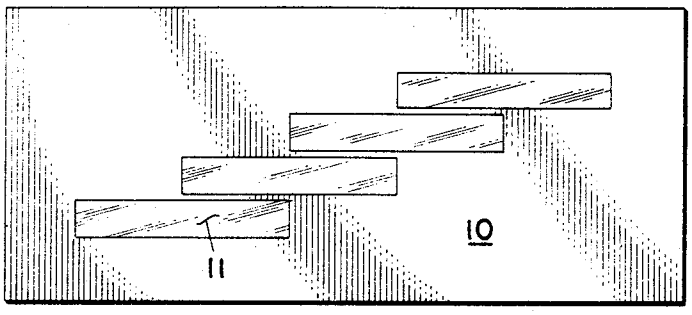
FIG. 1 is a somewhat schematic, plan view of a typical negative mask constructed according to the present invention.

With reference to FIG. 1, a completed mask for the production of a typical high-frequency strip line printed circuit is shown. An opaque coating 10 forms a background area which corresponds to a nonconductive area of a printed circuit to be formed with the mask, while transparent areas which correspond to conductive portions of the printed circuit are shown as circuit lines 11.

Figure 2:
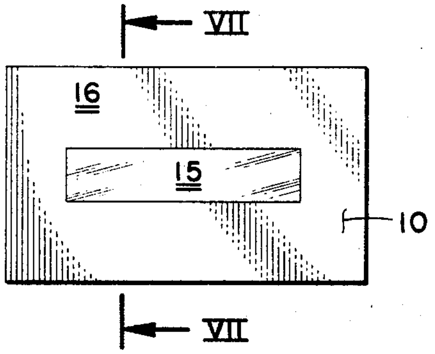
FIG. 2 is a similar, plan view of another negative mask constructed according to the present invention.

Referring now to FIG. 2, a negative mask of a very simple circuit is shown. The opaque coating 10 forms a background area 16; there is a single circuit line area 15.

Figure 3:
FIG. 3 through 7 are transverse, sectional views taken in the plane designated by the line VII—VII in FIG. 2 and showing a mask in various stages of its formation.

With reference to FIG. 3, a plate 12 of a transparent, electrically nonconductive material is provided as a base upon which the mask pattern is formed. The transparent material is substantially unaffected by its exposure to etches or other liquids used in this process and is of a flat material with at least its upper surface, as viewed in the drawing, having a smooth, consistent finish. Polished plate glass is a preferred material although, for economic reasons, sheet glass having exceptionally smooth surfaces has been used successfully. The sheet glass used is manufactured by PPG Industries, 1 Gatewaycenter, Pittsburgh, Pa. and is designated "DSB" sheet glass. Among the advantages provided by glass are its dimensional stability in spite of changes in the temperature and/or humidity of its environment.

Figure 4:
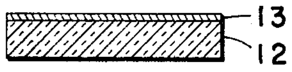

Referring now to FIG. 4, a thin coating 13 of an electrically conductive material is next formed on the plate 12. Silver is a preferred material for this coating 13 because of its high conductivity and commercial availability, although other conductive materials which may be used conveniently to form such a thin coating on the plate 12 may be used. A preferred method of applying the coating 13 is by the spraying of a silver salt solution, along with a salt reducing solution, on the smooth, upper surface of the plate 12.

The forming of such a silver coating by spray techniques is well-known in the art. Preferably, a sensitizing solution of stannous chloride ($SnCl_2$) is first sprayed on the plate 12 with a small spray gun and then washed off with deionized water. A silver nitrate ($AgNO_3$) salt solution is then sprayed on the plate 12 through a spray gun nozzle while a silver reducing solution such as a Rochelle salt solution is sprayed on the plate from another spray nozzle. The coating 13 thus formed is then sprayed with deionized water and dried with a filtered stream of air. Once the coating 13 has been formed, care should be taken to avoid scratching or soiling it with the fingers or any other object.

The thickness of the coating 13 is not very critical, but the coating should be even and continuous. There is, however, a preferred thickness. If the coating 13 is too thin, it will harden in a few hours and become difficult to scribe in the scribing process described below. If it is too thick, it may be difficult to remove from particular areas as required in subsequent steps to be described. A coating 13 of the preferred thickness has been found to have an optical density of about 1.0 to 1.5; the optical density may be determined by measurement with a densitometer or by comparing the coated plate 12 visually with a coated plate known to have a proper coating by observing a light source, such as a ceiling fixture, alternately through the two coated plates.

Figure 5:
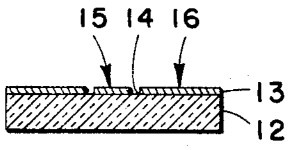
Figure 8:
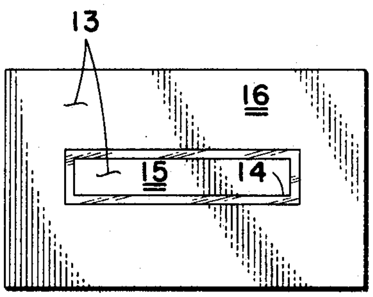
FIG. 8 is a plan view of the mask of FIG. 2 during a particular stage in its formation.

The coating 13 is then scribed along the peripheries of areas corresponding to conductive portions of a desired circuit pattern in such a manner that the areas are electrically isolated from remaining background areas. Referring to FIG. 8, a scribed line 14 forms the periphery of the circuit line area 15 which corresponds to the conductive portion of a printed circuit to be formed with the mask; the circuit line area 15 is thus electrically isolated, by the scribed line 14, from the background area 16 remaining. Referring now to FIG. 5, the circuit line area 15 is isolated from the background area 16 by the scribed line 14. The width of the scribed line 14 is not critical, but care should be taken to ensure that no gaps or metal chips exist along the scribed line which would allow electrical conduction between the circuit line area 15 and the background area 16. In scribing, the width of the scribed line 14 itself lies within the circuit line area 15, and the width of the scribed line produced by the scribing instrument used must be included in the computations of length and width of circuit line areas. The isolation of the circuit line area 15 may be checked with an ohmmeter by touching one prod of the instrument to the coating 13 in background area 16 and the other prod to the coating in circuit line area 15. The meter should indicate a substantially infinite resistance, e.g., an open circuit, between the two areas 15, 16.

The scribed plate 12 is next cleaned, in preparation for electroplating, by dipping it in acetone and rinsing it with deionized water. The plate 12 is then placed in an electrolyte solution, and the thin coating 13 in the background area 16 is connected to the negative terminal of a power supply. Copper is a preferred material for the electroplating metal, although other metals which may be electroplated over the thin coating 13 may be used. The copper will not plate in the circuit line area 15, for the power supply is connected to the thin coating 13 at the background area 16 only, and the background area is isolated from the circuit line areas. As an example, in electroplating, a voltage of between 1 and 5 volts, and a current of approximately 20–25 amperes per square foot of area to be plated has been found satisfactory. The plating is continued until the background area 16 is substantially opaque; as an example, it may be continued for approximately 7–10 minutes. If desired, a check may be made after the first visible deposit of the electrodeposited metal is formed to determine whether the plating is proceeding satisfactorily. The plating is stopped, and the plate 12 is removed from the electrolyte and inspected visually. If the plating is proceeding as it should, the thin coating 13 in the background area 16 is fully covered with a thin (though not necessarily uniform) coat of the electrodeposited metal, and none of the metal is deposited on the coating 13 in the circuit line area 15. The plate 12 is then returned to the electrolyte and the electroplating is completed.

Figure 6:
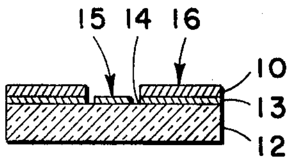

Referring to FIG. 6, upon completion of the electroplating process, the opaque coating 10 of electroplated material covers the thin coating 13 only in the background areas 16. For clarity, the thicknesses of the coatings 13, 10 have been greatly exaggerated in the drawing; it should also be understood that the opaque coating 10 is preferably much thicker than the thin coating 13.

Upon completion of the electroplating, the non-plated, thin coating 13 remaining in the circuit line area 15 is removed. A preferred method of removing the thin coating 13 is to etch the coating 13 away by immersing the plate 12 in an etching bath such as a solution of potassium ferricyanide ($K_3Fe(CN)_6$). A satisfactory etching solution is obtained by dissolving about 2 pounds of potassium ferricyanide crystals in one gallon of water. Etching is continued until the thin coating 13 disappears from the circuit line area 15; normally, 5 to 15 minutes is required to complete the etching. The etching process does not appreciably affect the electroplated background areas 16. In the case of the preferred materials, i.e., copper, silver, and potassium ferricyanide etchant, the etchant attacks the silver coating 13 in the circuit line area 15 but has little effect upon the copper coating 10 in the background areas 16. This is because the silver ferricyanide salt ($Ag_3[Fe(CN_6]$) produced by the action of the potassium ferricyanide solution upon the silver is more soluble than the product of its action upon the copper. The selective etching of various metals by appropriate etchants is known in the art, and other combinations of metals and etchants may be used to achieve similar results, provided that the metal used to form the coating 13 may be satisfactorily applied to the plate 12 as a thin coating, and provided that the metal used to form the opaque coating 10 may be successfully electroplated over the thin coating 13. For example, zinc or cadmium may be used as the thin coating 13, and nickel or cobalt are alternate materials for the electroplated coating 10. The fact that the electroplated opaque coating 10 is normally much thicker than the thin coating 13 also is a factor in reducing the relative action of the etchant upon the opaque coating 10.

An alternate and entirely satisfactory method is to remove the thin coating 13 in the circuit line area 15 when the plate 12 is removed from the electrolyte solution for inspection during the electroplating process. The opaque coating 10 must completely cover the thin coating 13 in the background area 16 before the removal of the thin coating 13 in the circuit line area 15 is begun, however, since any uncovered areas in the background area 16 would be acted upon by the etchant used. Following inspection of the plate 12 and removal of the thin coating 13 in the circuit line area 15, the plate is returned to the electrolyte solution, electrical connection is again made to the background area 16, and electroplating is completed.

Figure 7:
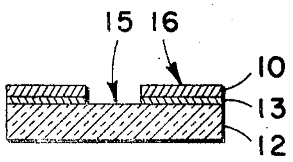

Referring to FIG. 7, the opaque coating 10 and the thin coating 13 remain in the background area 16, while the circuit line area 15 has no such coating and is therefore transparent. The mask can now be used in preparing printed circuits by the contact printing method previously described. If the coating 13 is very thin, it is substantially transparent. In such a case, an alternative method is to omit the above-described step of removing the thin coating 13 in the circuit line area 15 and use the mask as it is shown in FIG. 6.

In practice, it is often desirable to make duplicate masks for use in the contact printing process in order to protect the original from accidental breakage or from deterioration from handling and wear during the contact printing. Such a duplicate mask can be made photographically in several ways. A preferred method of reproduction is to use a commercial printing material which requires only one contact printing step to provide a duplicate if the mask to be reproduced is symmetrical. (Two printing steps are required if the mask is not symmetrical.) Such a material is Kodak Autopositive Plate, available from Eastman Kodak Company, Rochester, New York. Several of these copies may be made as required in subsequent production of actual printed circuits. Or, if only a few printed circuit boards need be formed from the original negative mask, it may be used in the contact printing process itself.

The method of the subject invention thus eliminates the photographic reduction process, with its inherent difficulties, expense, and opportunities for error. Since the image is scribed in its actual size, no expensive graphic arts camera is needed for reduction of the image. Circuit lines of any size or shape may be formed with extreme accuracy in the very thin coating 13. The use of glass for the plate 12 provides a high degree of dimensional stability for the mask because of the relatively great stability of glass in environments of changing temperature and/or humidity. Thus, the process need not be conducted in a controlled environment of constant temperature and humidity, and the expense of providing facilities for producing such an environment is eliminated. Therefore, the method is economically feasible even for small producers or where only limited production is needed.

It is apparent that other variations and modifications of its steps may be made without departing from the present invention. Accordingly, it should be understood that the forms of the present invention described above and shown in the accompanying drawing are illustrative only and not intended to limit the scope of the invention.

What is claimed is:

1. A method of forming a negative mask for use in the production of printed circuits and the like, comprising:

forming a thin, electrically conductive coating on a transparent, electrically nonconductive plate;

scribing in the thin coating along the peripheries of areas corresponding to conductive portions of a desired circuit pattern in such a manner that said areas are electrically isolated from background areas which remain;

electroplating the background areas until they are substantially opaque; and removing the thin, electrically conductive coating in the electrically isolated areas.

2. The method recited in claim 1, the plate being formed of glass.

3. The method claimed in claim 1, the step of electroplating the background areas being accomplished by electroplating apparatus in which the background area of the thin coating forms the cathode, electrical connection being made to the thin coating only at the background area.

4. The method of claim 1, the step of removing the thin, electrically conductive coating being accomplished by etching the plate until the thin coating is substantially dissolved only in the electrically isolated areas.

5. A method of forming a negative mask for use in production of printed circuits and the like, comprising:

forming a thin, electrically conductive coating on a transparent, electrically nonconductive plate;

scribing in the thin coating along the peripheries of areas corresponding to conductive portions of a desired circuit pattern in such a manner that said areas are electrically isolated from background areas which remain;

electroplating the background areas until they are covered with the electroplated metal;

removing the thin, electrically conductive coating in the electrically isolated areas; and electroplating the background areas until they are substantially opaque.

6. A method of forming a negative mask for use in the production of printed circuits and the like, comprising:

forming a thin, substantially transparent, electrically conductive coating on a transparent, electrically nonconductive plate;

scribing in the thin coating along the peripheries of areas corresponding to conductive portions of a desired circuit pattern in such a manner that said areas are electrically isolated from background areas which remain; and electroplating the background areas until they are substantially opaque.

References Cited

UNITED STATES PATENTS

| | | | |
|---|---|---|---|
| 2,279,567 | 4/1942 | Holman | 204—15 |
| 2,805,986 | 9/1957 | Law | 204—11 |
| 3,190,778 | 6/1965 | Dahlberg | 204—11 |
| 3,342,706 | 9/1967 | Liben et al. | 204—11 |
| 3,402,110 | 9/1968 | Scherrer | 204—11 |

J. H. MACK, Primary Examiner

T. TUFARIELLO, Assistant Examiner

U.S. Cl. X.R.

204—11